US009750151B2

(12) United States Patent
Morales et al.

(10) Patent No.: US 9,750,151 B2
(45) Date of Patent: Aug. 29, 2017

(54) ELECTROMECHANICAL ASSEMBLY WITH FLOATING TERMINAL HOLDING FEATURES

(71) Applicant: DELPHI TECHNOLOGIES, INC., Troy, MI (US)

(72) Inventors: Jesus R. Morales, Chihuahua (MX); Kevin G. Munoz, Chihuahua (MX); Alvaro Gino De La Reza, El Paso, TX (US); Rodrigo Villanueva, Chihuahua (MX)

(73) Assignee: DELPHI TECHNOLOGIES, INC., Troy, MI (US)

( * ) Notice: Subject to any disclaimer, the term of this patent is extended or adjusted under 35 U.S.C. 154(b) by 0 days.

(21) Appl. No.: 14/974,780

(22) Filed: Dec. 18, 2015

(65) Prior Publication Data

US 2017/0181305 A1 Jun. 22, 2017

(51) Int. Cl.
| | |
|---|---|
| *H05K 7/00* | (2006.01) |
| *H05K 5/00* | (2006.01) |
| *G11B 33/02* | (2006.01) |
| *H05K 7/10* | (2006.01) |
| *H05K 1/03* | (2006.01) |
| *H05K 7/02* | (2006.01) |

(52) U.S. Cl.
CPC .............. *H05K 7/10* (2013.01); *H05K 1/0366* (2013.01); *H05K 7/026* (2013.01); *H05K 2201/068* (2013.01)

(58) Field of Classification Search
CPC ...................................................... H05K 7/026

USPC ..................................................... 361/679.21
See application file for complete search history.

(56) References Cited

U.S. PATENT DOCUMENTS

| | | | |
|---|---|---|---|
| 6,488,550 B1 | 12/2002 | Kikuchi et al. | |
| 2006/0246752 A1 | 11/2006 | Ishiguro et al. | |
| 2008/0130224 A1 | 6/2008 | Hashikura et al. | |
| 2009/0269951 A1* | 10/2009 | Scheele .................. | H05K 7/026 439/76.2 |
| 2011/0084549 A1 | 4/2011 | Scheele et al. | |
| 2011/0299229 A1* | 12/2011 | De La Reza ....... | B60R 16/0238 361/624 |
| 2014/0199891 A1* | 7/2014 | Jozwiak ................ | H01R 24/66 439/655 |

FOREIGN PATENT DOCUMENTS

DE           9100962 U1     5/1991

\* cited by examiner

*Primary Examiner* — Jerry Wu
(74) *Attorney, Agent, or Firm* — Robert J. Myers

(57) ABSTRACT

An electromechanical assembly includes a generally planar printed circuit board (PCB), an electrical terminal electrically and mechanically connected to the PCB and projecting from a major surface of the PCB, and a housing formed of a dielectric material having a base portion and a terminal portion. The terminal portion defines a cavity and the electrical terminal is disposed within this cavity. The terminal portion is disposed within a aperture that is defined by the base portion. The electromechanical assembly defines a gap between the base portion and the terminal portion. The terminal portion is connected to the base portion by a pair of flexible beams which may have a serpentine or ogee curve shape, each of which is attached between one of two opposed sides of the base portion and the terminal portion.

18 Claims, 7 Drawing Sheets
(2 of 7 Drawing Sheet(s) Filed in Color)

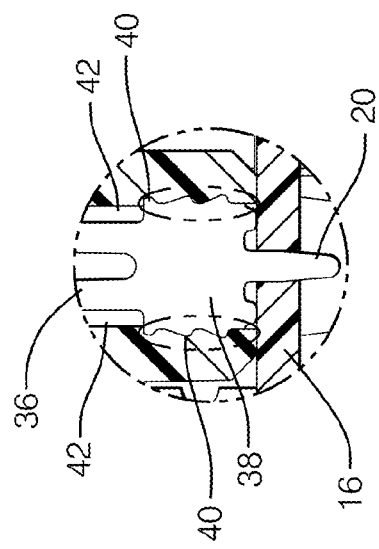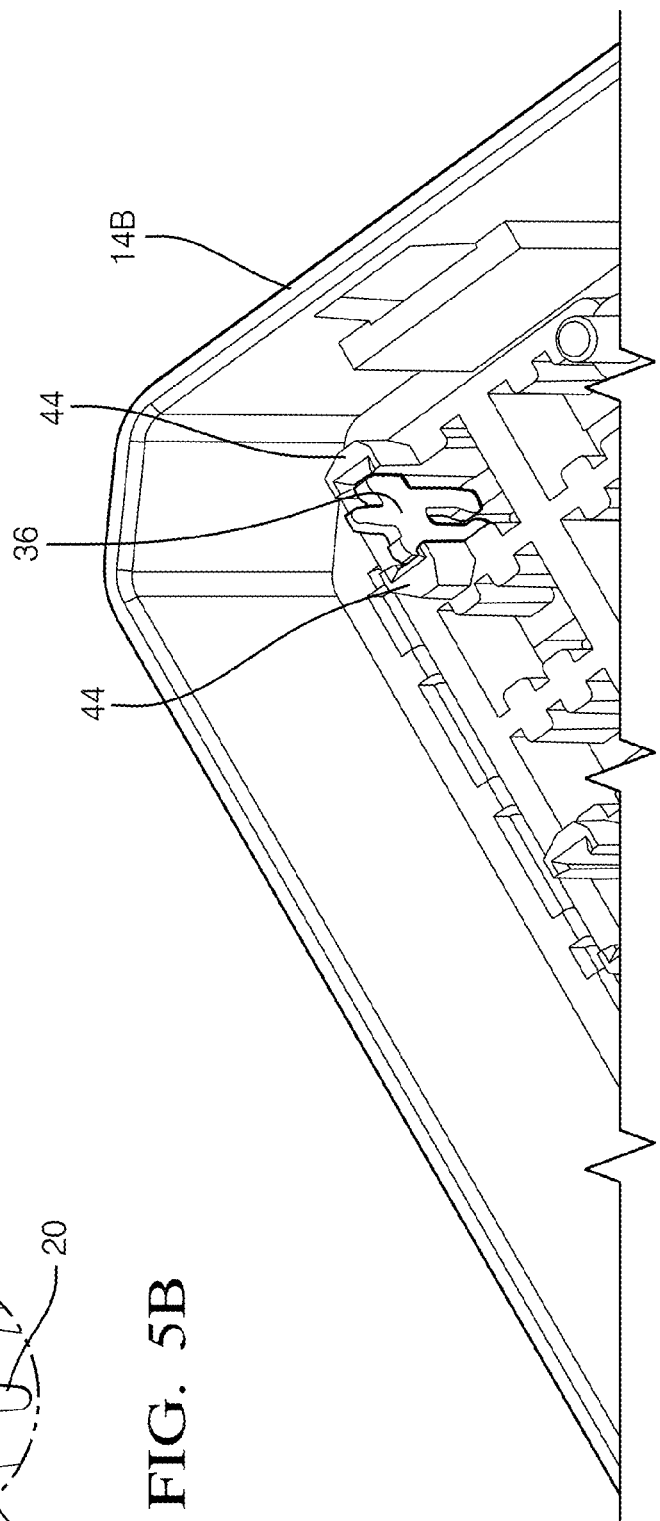

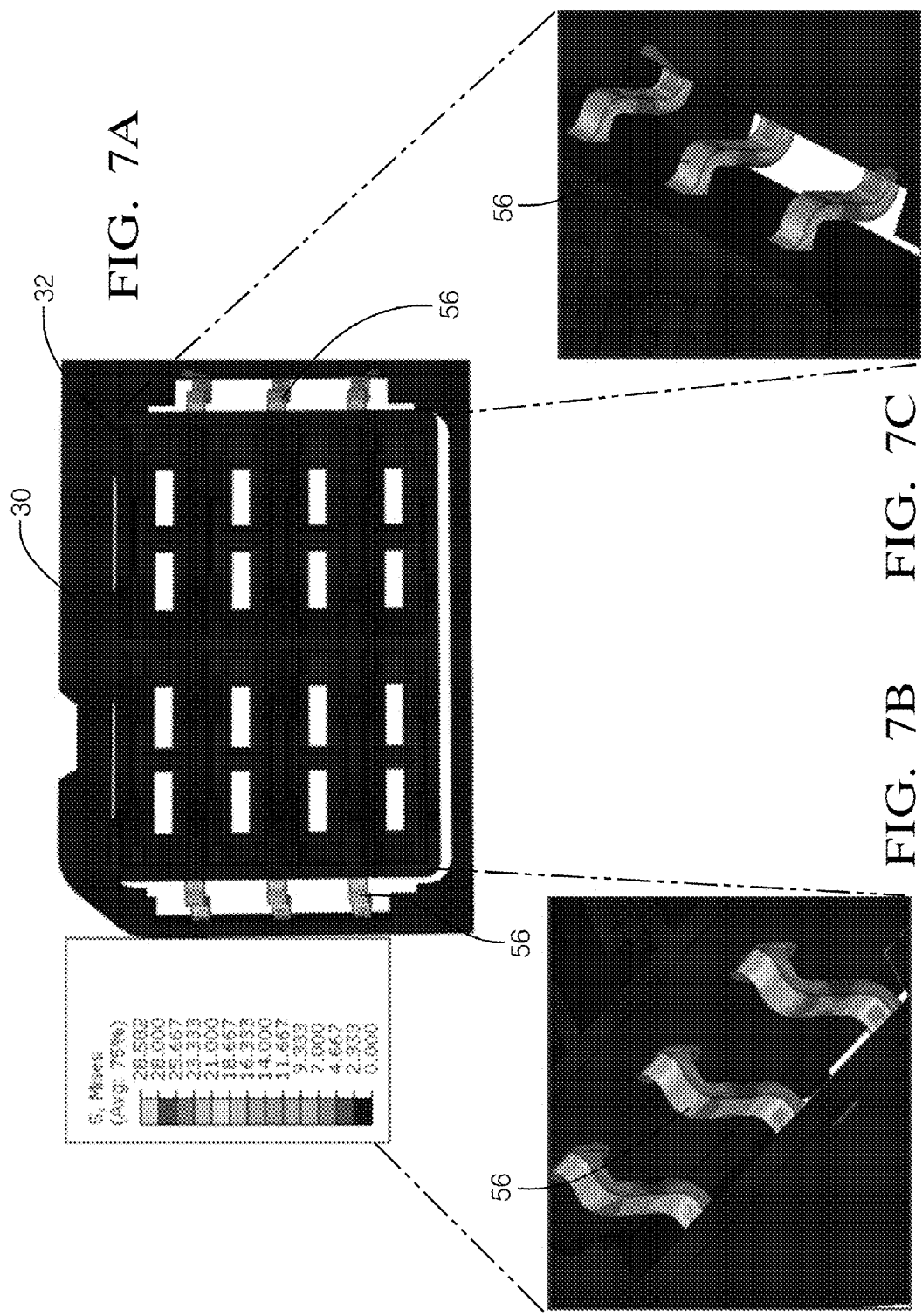

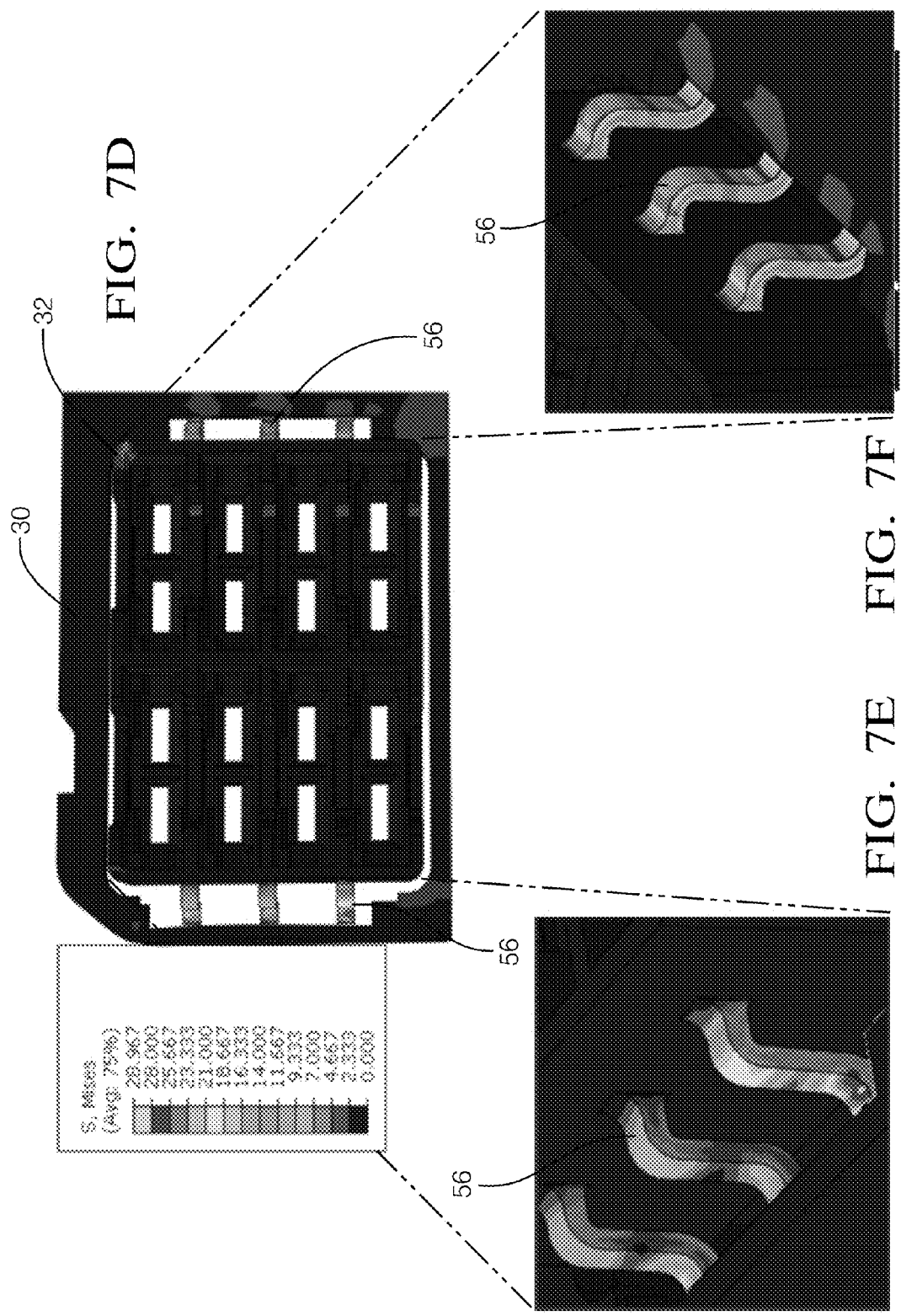

ELECTROMECHANICAL ASSEMBLY WITH FLOATING TERMINAL HOLDING FEATURES

TECHNICAL FIELD OF THE INVENTION

The invention relates to electromechanical assemblies, particularly an electromechanical assembly with floating terminal holding features.

BACKGROUND OF THE INVENTION

Electromechanical assemblies, such as electrical distribution centers used in motor vehicles, include printed circuit boards (PCBs) made from one material, such as glass fiber reinforced resin, interconnected to electrical components, e.g. terminals and fuses, made of a different material, e.g. metal, and a housing made of yet another material, e.g. thermoset plastic. Differences in coefficient of thermal expansion (CTE) of the materials used for the PCB, the electrical components, and the plastic housing may produce stresses that must be taken into account in the design of electromechanical assemblies as they may affect the electrical performance and reliability of the interface between the PCB and the electrical components. Currently, designers of electromechanical assemblies must carefully consider the CTE of each material used and design in adequate clearance between the electrical components and the housing to accommodate the differences in thermal expansion between the PCB, the electrical components, and the plastic housing. Therefore, features in electromechanical assemblies that can more easily accommodate differences in CTE of material used in the PCB, the electrical components, and the plastic housing remain desired.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF THE INVENTION

In accordance with an embodiment of the invention, an electromechanical assembly is provided. The electromechanical assembly includes a generally planar printed circuit board (PCB), an electrical terminal electrically and mechanically connected to the PCB and projecting from a major surface of the PCB, and a housing formed of a dielectric material having a base portion and a terminal portion. The terminal portion defines a cavity and the electrical terminal is disposed within this cavity. The terminal portion is disposed within a aperture that is defined by the base portion. The terminal portion is connected to the base portion by a pair of flexible beams, each of which is attached between one of two opposed sides of the base portion and the terminal portion. The electromechanical assembly defines a gap between the base portion and the terminal portion.

The pair of flexible beams may each comprise a first arcuate section, a second arcuate section, and a straight section intermediate the first arcuate section and the second arcuate section. The first arcuate section may be attached to the base portion and the second arcuate section may be attached to the terminal portion. A first radius of the first arcuate section may be greater than a second radius of the second arcuate section.

The base portion, the terminal portion, and the pair of flexible beams may be integrally formed. The PCB may be mechanically attached to the base portion.

A base section of the electrical terminal may define serrations that are configured to provide an interference fit with a pair of walls of the cavity, thereby mechanically attaching the electrical terminal to the terminal portion.

In accordance with another embodiment of the invention, the terminal portion is connected to the base portion by a plurality of flexible serpentine beams each of which is attached between one of two opposed sides of the base portion and the terminal portion. The base portion, the terminal portion, and the plurality of flexible beams may be integrally formed.

In accordance with yet another embodiment, an electromechanical assembly includes a generally planar printed circuit board (PCB), an electrical terminal electrically and mechanically connected to the PCB and projecting from a major surface of the PCB, an electrical component, and a housing formed of a dielectric material having a base portion and a terminal portion. The terminal portion defines a first cavity and the electrical terminal is disposed within said first cavity thereby mechanically attaching the electrical terminal to the terminal portion. The terminal portion further defines a second cavity in communication with the first cavity. The electrical component is disposed within the second cavity. The terminal portion is disposed within a aperture defined by the base portion, and wherein the terminal portion is connected to the base portion by a plurality of flexible ogee curved beams each of which is attached between one of two opposed sides of the base portion and the terminal portion.

The electrical component comprises a mating electrical terminal electrically connected to the electrical terminal. The electrical component may be characterized as a fusible link.

A base section of the electrical terminal defines serrations configured to provide an interference fit with a pair of walls of the first cavity, thereby mechanically attaching the electrical terminal to the terminal portion.

The aperture defines a gap between the base portion and the terminal portion. The base portion, the terminal portion, and the plurality of curved beams may be integrally formed. The PCB may be mechanically attached to the base portion.

The electromechanical assembly may be characterized as an electrical distribution center that is configured for use in a motor vehicle.

BRIEF DESCRIPTION OF THE SEVERAL VIEWS OF THE DRAWING

The patent or application file contains at least one drawing executed in color. Copies of this patent or patent application publication with color drawing(s) will be provided by the Office upon request and payment of the necessary fee.

The present invention will now be described, by way of example with reference to the accompanying drawings, in which:

FIG. 5B is close-up cross section side view of the portion of the electromechanical assembly of FIG. 5A according to one embodiment;

FIG. 6 is a bottom perspective view of the portion of the electromechanical assembly of FIG. 3B along a longitudinal axis according to one embodiment;

FIGS. 7A-C are views of the portion of the electromechanical assembly of FIG. 3B illustrating stresses created by displacement along the lateral axis according to one embodiment; and FIGS. 7D-F are views of the portion of the electromechanical assembly of FIG. 3B illustrating stresses created by displacement along the longitudinal axis according to one embodiment.

DETAILED DESCRIPTION OF THE INVENTION

An electromechanical assembly is presented herein having a housing constructed to contain a printed circuit board (PCB). The PCB includes electrical terminals that are configured to connect with mating electrical terminals of a wiring harness or pluggable electrical component, such as a relay or fuse. The housing includes a base portion and a terminal portion in which the connecting section of the terminals are enclosed. The terminal portion is disposed within an aperture defined by the base portion and is interconnected to the base portion by a number of flexible beams that are configured to allow several degrees of freedom for relative movement between the terminal portion and the base portion of the housing. This allows the terminal portion to "float" relative to the base portion and reduces stress buildup on the terminals, housing, PCB and electrical components caused by differences in coefficients of thermal expansion of the different materials used to construct these components.

Figure 1:
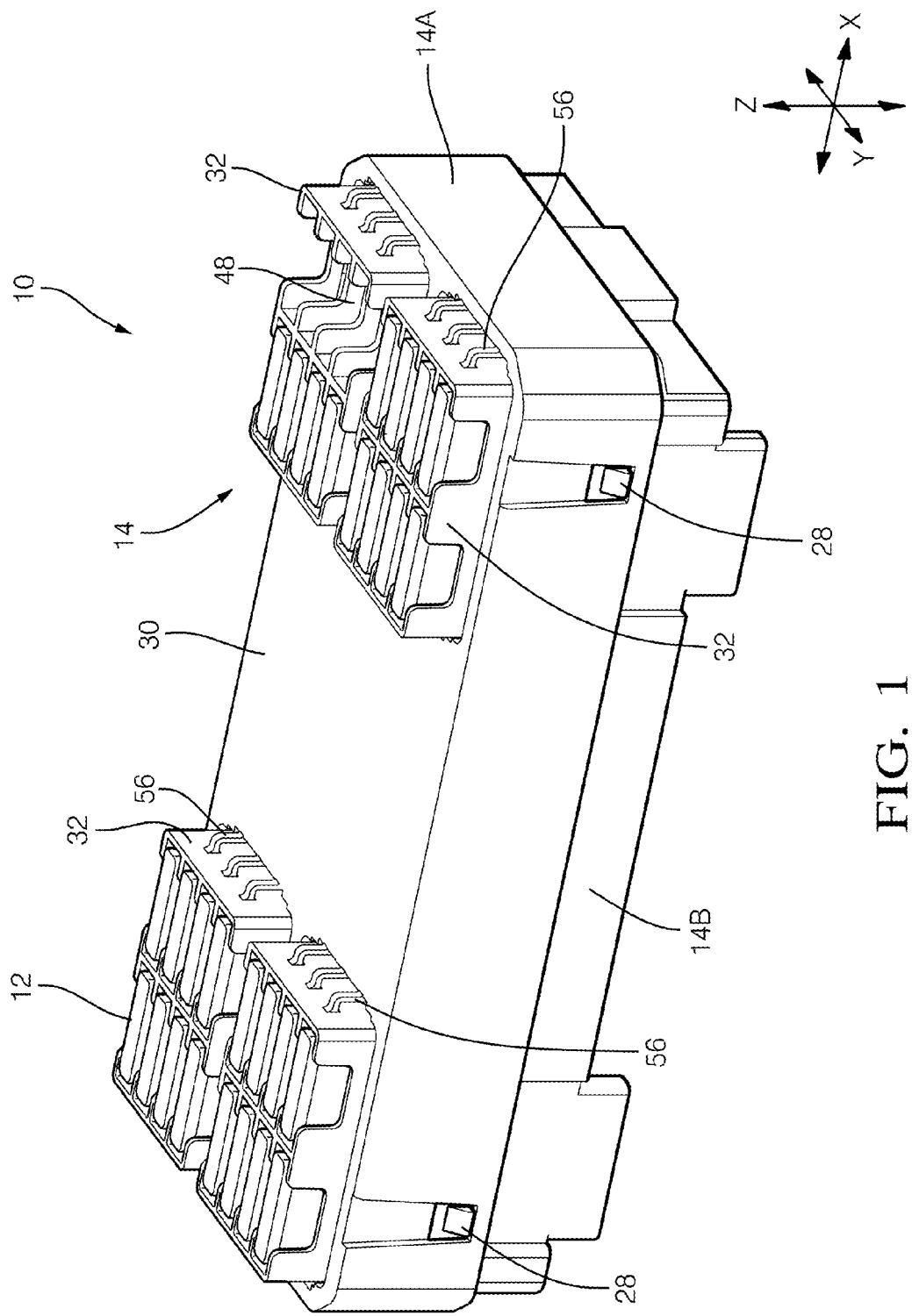
FIG. 1 is a perspective view of an electromechanical assembly according to one embodiment.
Figure 2:
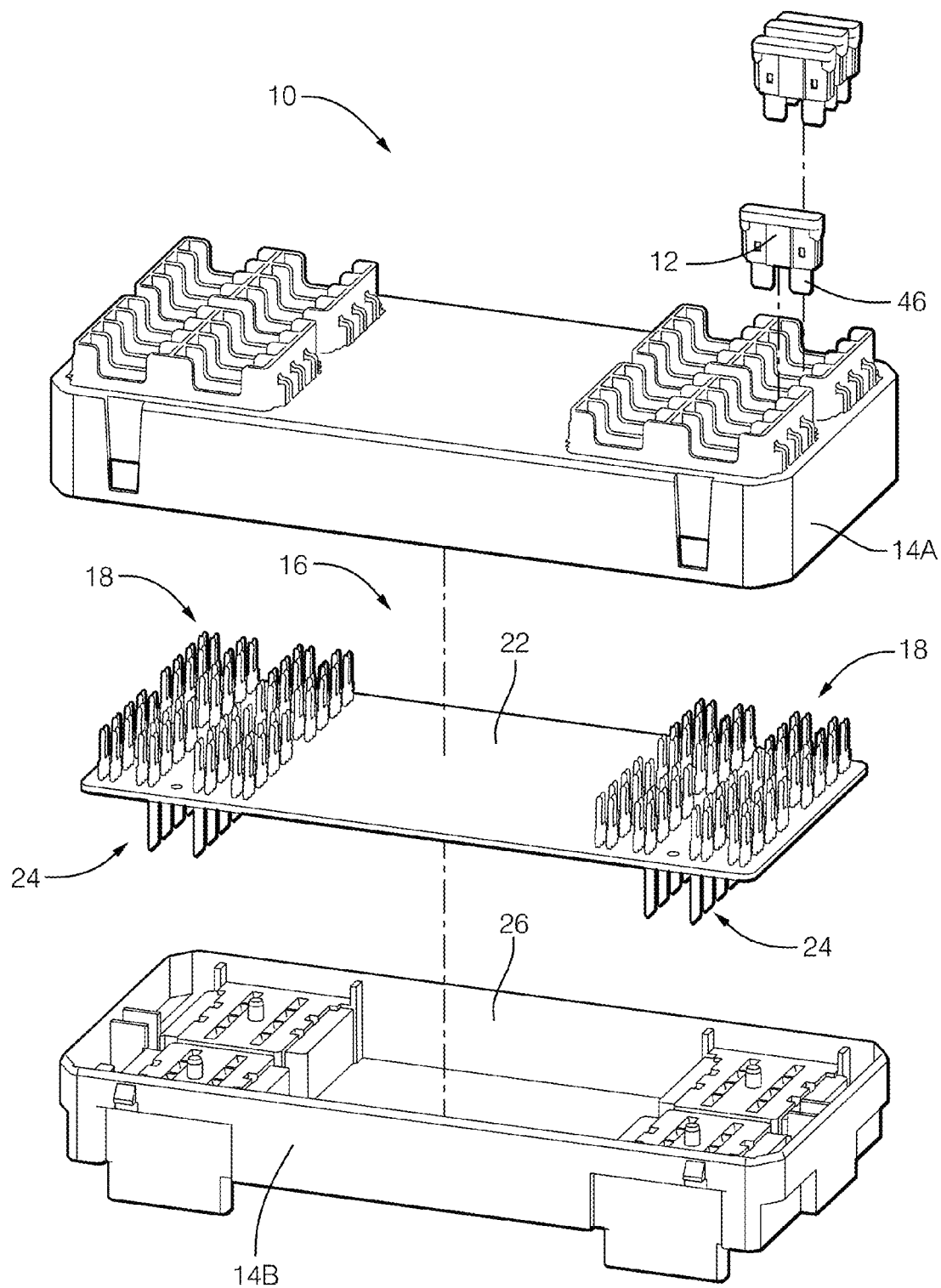
FIG. 2 is an exploded perspective view of the electromechanical assembly of FIG. 1 according to one embodiment.

FIG. 1 illustrates a non-limiting example of an electromechanical assembly 10, in this example an distributed electrical center (DEC) 10 configured for use in a motor vehicle. The DEC 10 is configured to branch electrical power from a main power bus (not shown) in the vehicle to wiring harnesses (not shown) connected to various subsystems and typically includes electrical components such as circuit protection devices, e.g. fuses or circuit breakers. The DEC 10 may also include other electronic components such as a diodes, switches, and relays to control the flow of electrical power through the DEC 10. As shown in FIG. 2, the DEC 10 includes a housing 14, a printed circuit board (PCB) 16, and the electrical components 12.

As shown in FIG. 2, the DEC 10 includes a generally planar PCB 16. The PCB 16 may be formed of circuit board substrates that are made of epoxy or polyimide resins. The resin may be reinforced with a woven glass cloth or other matrix such as chopped fibers. Substrates formed of such materials are typically referred to as FR-4 or G-10 type circuit boards. The circuit board substrate may alternatively be constructed of ceramic or rigid polymer materials. This listing of acceptable substrate materials is not exhaustive and other materials may also be used successfully. A layer of conductive material, such as a copper based material is electroplated on at least one major surface of the circuit board substrate. The layer of conductive material is then formed to create the conductive traces and conductive pads typically by using a chemical etching process.

Figure 5A:
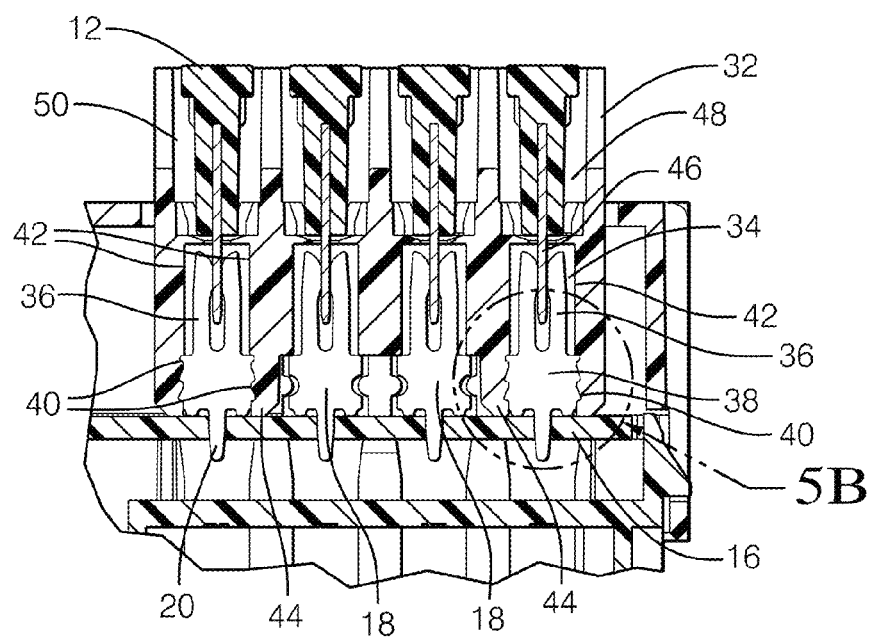
FIG. 5A is a cross section side view of the portion of the electromechanical assembly of FIG. 3B along a lateral axis according to one embodiment.

Electrical component terminals 18, hereinafter referred to as terminals 18, are electrically and mechanically connected to the PCB 16. As best shown in FIG. 5A, tangs 20 projecting from base portions of the terminals 18 are received within holes in the PCB 16 that are surrounded by conductive pads (not shown). The terminals 18 are then attached to the conductive pads, e.g. by a soldering process. The terminals 18 project substantially perpendicularly from a major surface, in this example a top surface 22, of the PCB 16. As used herein, substantially perpendicular is ±5% of absolutely perpendicular. As shown in the illustrated example of FIG. 5A, the terminals 18 are female "tuning fork" terminals that are configured to receive corresponding male blade terminals. Other embodiments of the DEC may be envisioned using alternative terminal types well known to those skilled in the art. As shown in FIG. 2, electrical connector terminals 24 are similarly attached a conductive pad on the opposite major surface, i.e. a bottom surface, of the PCB 16. The housing 14 defines a wiring connector socket (not shown) and the electrical connector terminals 24 are configured to interconnect with mating terminals (not shown) attached to a wiring harness (not shown) used for power distribution.

The housing 14 is formed of a dielectric material, e.g. polybutylene terephthalate (PBT), polypropylene (PP), or polyamide (PA, commonly known as NYLON). The housing 14 includes a lower housing 14A and an upper housing 14B that together define a housing cavity 26 configured to contain the PCB 16. The upper housing 14B may be secured to the lower housing 14A by flexible snap features 28 as best shown in FIG. 1. Threaded fasteners or other fastening means known to those skilled in the art may alternatively be used. The upper housing 14B has a base portion 30 and at least one terminal portion 32. The terminal portion 32 defines a terminal cavity 34 and the electrical terminals 18 are disposed within this terminal cavity 34. As illustrated in FIGS. 5A and 5B some of the terminals 18 are serrated terminals 36 having a base section 38 of the terminal that defines serrations 40 that are configured to "bite" into the inner walls 42 of the terminal cavity 34 and provide an interference fit between the serrated terminal 36 and the inner walls 42 of the terminal cavity 34, thereby mechanically attaching the serrated terminal 36 to the terminal portion 32 of the upper housing 14B. As shown in FIG. 6, the terminal cavities 34 receiving the serrated terminals 36 include extensions 44 that are configured to provide additional inner wall 42 surface area for the serrations 40 to contact. Only a portion of the terminals 18, such as those located in the corners of the terminal portion 32, are serrated terminals 36 in order to minimize the insertion force required to connect the serrated terminals 36 to the terminal portion 32. Other terminals 18 do not include these serrations.

Figure 4:
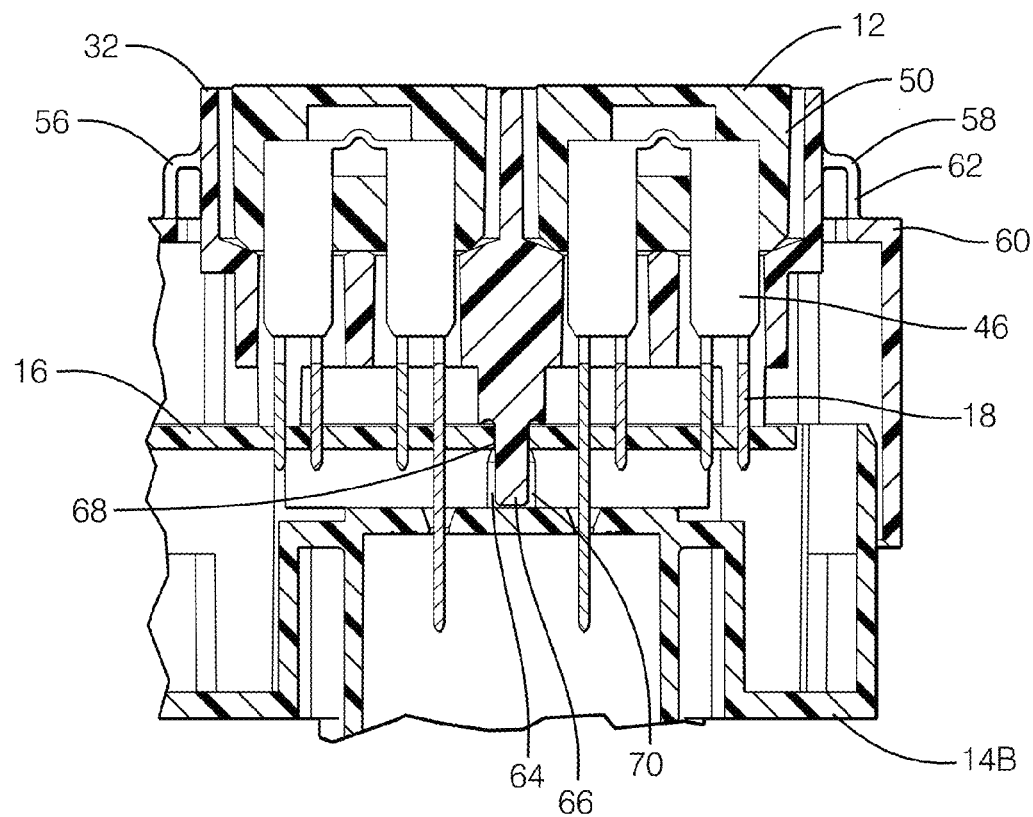
FIG. 4 is a cross section side view of the portion of the electromechanical assembly of FIG. 3B along a longitudinal axis according to one embodiment.

The electrical components 12, e.g. fuses 12, have a mating electrical terminal 46, e.g. a male blade terminal, that is configured to be mechanically and electrically connected to the terminals 18, 36. As shown in FIGS. 4 and 5A, the terminal portion 32 further defines a component cavity 48 that is in communication with the terminal cavity 34 and is configured to receive the electrical component. Inner walls 50 of the component cavity 48 are shaped to conform to the shape of the electrical component 12 so as to guide the mating terminal 46 into engagement with the terminal 18, 36. The fuse 12 is disposed within this component cavity 48. The fuse 12 may alternatively be another type of replaceable electrical component, such as a pluggable relay or circuit breaker.

Figure 3A:
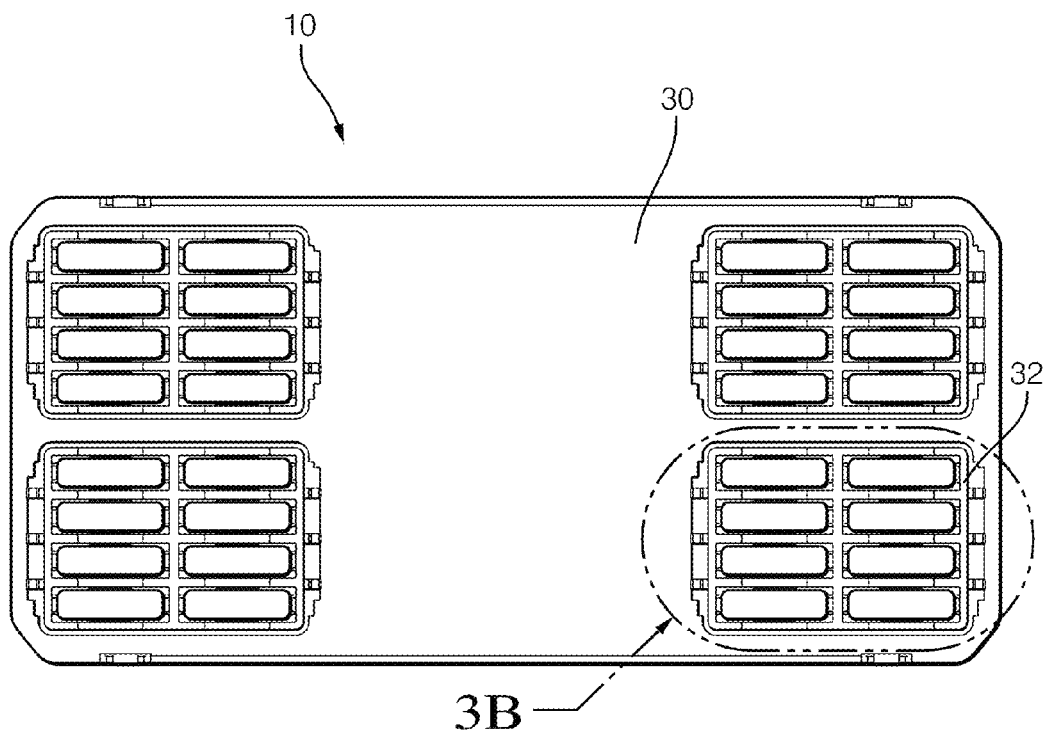
FIG. 3A is a top view of the electromechanical assembly of FIG. 1 according to one embodiment.
Figure 3B:
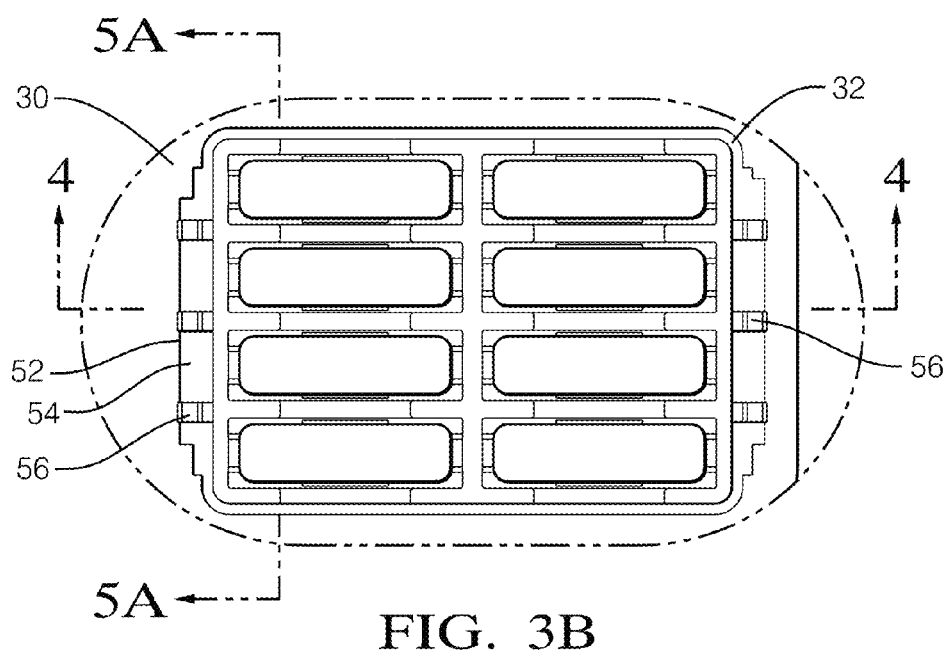
FIG. 3B is a close-up top view of a portion of the electromechanical assembly of FIG. 1 according to one embodiment.

As best shown in FIG. 3B, the terminal portion 32 of the upper housing 14B is disposed within a aperture 52 defined by the base portion 30 of the upper housing 14B. The aperture 52 defines a gap 54 between the base portion 30 and the terminal portion 32 allowing the terminal portion 32 to move not only along a vertical axis Z of the housing 14, but also along a longitudinal axis X and a lateral axis Y of the housing 14. As used herein, the longitudinal, lateral, and vertical axes X, Y, Z are mutually orthogonal to one another.

The terminal portion 32 is connected to the base portion 30 across the gap 54 by at least a pair of flexible beams 56. Each of the flexible beams 56 are attached between one of two opposed sides of the base portion 30 and the terminal portion 32. As best illustrated in FIG. 4, there are a plurality of flexible beams 56 attached to each of two opposed sides of the base portion 30 and the terminal portion 32. The inventors have found that satisfactory performance was provided by flexible beams 56 having a first arcuate section 58 connected to the base portion 30 and a second arcuate section 60 attached to the terminal portion 32 with a substantially straight section 62 therebetween. In this non-liming example, a first radius of the first arcuate section 58 is greater than a second radius of the second arcuate section 60. The flexible beams 56 have a substantially square cross section. The first and second arcuate sections 58, 60 are arranged so that the flexible beams 56 may be characterized as having a serpentine or ogee curved shape.

Finite element analysis was performed at the direction of the inventors for an upper housing 14B formed of PP having a terminal portion 32 attached to a base portion 30 by flexible beams 56 having the serpentine or ogee curved shape so described were subjected to forces caused by a displacement of 0.4 millimeters (mm) along the longitudinal axis X and a displacement of 0.3 mm along the lateral axis Y simulating displacement caused by thermal expansion. Stresses exhibited by the flexible beams 56 remained below the yield stress (28 MPa) of the material forming the flexible beams 56. The results of the finite element analysis for the lateral displacement are shown in FIGS. 7A-C and results of the finite element analysis for the longitudinal displacement are shown in FIGS. 7D-F. Flexible beams 56 having other shapes not evaluated by the inventors may also be found to provide acceptable performance.

The base portion 30, the terminal portion 32, and the pair of flexible beams 56 of the upper housing 14B are integrally formed of the same material, e.g. by injection molding the entire upper housing 14B in a single mold.

As shown in FIG. 4, the terminal portion also defines a tower 64 having a projection 66 that protrudes through a hole 68 in the PCB 16 and is received in a socket 70 defined by the lower housing 14A. This tower 64 is configured to move the terminal portion 32 when thermal expansion is experienced.

Accordingly a electromechanical assembly 10 is provided. The "floating" terminal portion 32 of the housing 14 of the electromechanical assembly 10 provides the benefits of reducing the stresses experienced by the mechanical interfaces between the PCB 16, terminals 18, housing 14, and electrical components 12 caused by differences in the coefficients of expansion of the different materials forming these elements, thus reducing the occurrences of stress fractures in the terminal/PCB interface that degrade the reliability of the electrical connections within the electromechanical assembly 10. This electromechanical assembly 10 also allows for tighter dimensional tolerances for the component cavities, thus reducing the occurrence of misalignment of mating terminals 46 with the terminals 18 during insertion of electrical components 12. This electromechanical assembly 10 further permits expanded options for material selections used for the PCB 16, terminals 18, and housing 14 because larger differences in coefficients of thermal expansion between the material can be tolerated.

While this invention has been described in terms of the preferred embodiments thereof, it is not intended to be so limited, but rather only to the extent set forth in the claims that follow. Moreover, the use of the terms first, second, etc. does not denote any order of importance, but rather the terms first, second, etc. are used to distinguish one element from another. Furthermore, the use of the terms a, an, etc. do not denote a limitation of quantity, but rather denote the presence of at least one of the referenced items.

We claim:

1. An electromechanical assembly, comprising:
a generally planar printed circuit board (PCB);
an electrical terminal electrically and mechanically connected to the PCB and projecting from a major surface of the PCB; and
a housing formed of a dielectric material having a base portion and a terminal portion, wherein the terminal portion defines a cavity and the electrical terminal is disposed within said cavity, wherein the terminal portion is disposed within a aperture defined by the base portion, wherein the terminal portion is connected to the base portion by a first flexible beam extending from a first side of the terminal portion, and wherein the terminal portion is further connected to the base portion by a second flexible beam extending from a second side of the terminal portion opposite the first side.

2. The electromechanical assembly according to claim 1, wherein the aperture defines a gap between the base portion and the terminal portion.

3. The electromechanical assembly according to claim 1, wherein the first and second flexible beams each comprise a first arcuate section.

4. The electromechanical assembly according to claim 3, wherein the first and second flexible beams each comprise a second arcuate section and a straight section intermediate the first arcuate section and the second arcuate section.

5. The electromechanical assembly according to claim 4, wherein the first arcuate section is attached to the base portion and the second arcuate section is attached to the terminal portion.

6. The electromechanical assembly according to claim 5, wherein a first radius of the first arcuate section is greater than a second radius of the second arcuate section.

7. The electromechanical assembly according to claim 1, wherein the PCB is mechanically attached to the base portion.

8. The electromechanical assembly according to claim 1, wherein a base section of the electrical terminal defines serrations configured to provide an interference fit with a pair of walls of the cavity, thereby mechanically attaching the electrical terminal to the terminal portion.

9. An electromechanical assembly, comprising: a generally planar printed circuit board (PCB); an electrical terminal electrically and mechanically connected to the PCB and projecting from a major surface of the PCB; and a housing formed of a dielectric material having a base portion and a terminal portion, wherein the terminal portion defines a cavity and the electrical terminal is disposed within said cavity, wherein the terminal portion is disposed within a aperture defined by the base portion; wherein the terminal portion is connected to the base portion by a first flexible beam extending from a first side of the terminal portion, and wherein the terminal portion is further connected to the base portion by a second flexible beam extending from a second side of the terminal portion opposite the first side.

10. The electromechanical assembly according to claim 9, wherein the aperture defines a gap between the base portion and the terminal portion.

11. The electromechanical assembly according to claim 9, wherein the PCB is mechanically attached to the base portion.

12. The electromechanical assembly according to claim 9, wherein a base section of the electrical terminal defines serrations configured to provide an interference fit with a pair of walls of the cavity, thereby mechanically attaching the electrical terminal to the terminal portion.

13. An electromechanical assembly, comprising:
a generally planar printed circuit board (PCB); an electrical terminal electrically and mechanically connected to the PCB and projecting from a major surface of the PCB; an electrical component; and a housing formed of a dielectric material having a base portion and a terminal portion, wherein the terminal portion defines a first cavity and the electrical terminal is disposed within said first cavity thereby mechanically attaching the electrical terminal to the terminal portion, wherein the terminal portion defines a second cavity in communication with the first cavity, wherein the electrical component is disposed within the second cavity, wherein the terminal portion is disposed within a aperture defined by the base portion; wherein the terminal portion is connected to the base portion by a first flexible ogee curved beam extending from a first side of the terminal portion, and wherein the terminal portion is further connected to the base portion by a second flexible ogee curved beam extending from a second side of the terminal portion opposite the first side.

14. The electromechanical assembly according to claim 13, wherein the electrical component comprises a mating electrical terminal electrically connected to the electrical terminal.

15. The electromechanical assembly according to claim 13, wherein the electrical component is characterized as a fusible link.

16. The electromechanical assembly according to claim 15, wherein the electromechanical assembly is characterized as an electrical distribution center and is configured for use in a motor vehicle.

17. The electromechanical assembly according to claim 13, wherein a base section of the electrical terminal defines serrations configured to provide an interference fit with a pair of walls of the first cavity, thereby mechanically attaching the electrical terminal to the terminal portion.

18. The electromechanical assembly according to claim 13, wherein the aperture defines a gap between the base portion and the terminal portion, wherein the base portion, the terminal portion, and the plurality of curved beams are integrally formed, and wherein the PCB is mechanically attached to the base portion.

* * * * *